United States Patent [19]

Laridon et al.

[11] 4,255,513
[45] Mar. 10, 1981

[54] PHOTOPOLYMERIZABLE RECORDING MATERIALS

[75] Inventors: Urbain L. Laridon, Wilrijk; August M. Mariën, Oevel; Walter F. De Winter, s'-Gravenwezel; Hendrik E. Kokelenberg, Merksem, all of Belgium

[73] Assignee: AGFA-GEVAERT N.V., Mortsel, Belgium

[21] Appl. No.: 64,895

[22] Filed: Aug. 8, 1979

[30] Foreign Application Priority Data

Aug. 25, 1978 [GB] United Kingdom ............... 34738/78

[51] Int. Cl.³ ................................................. G03C 1/68
[52] U.S. Cl. ................................ 430/281; 204/159.18; 204/159.23; 430/287; 430/288; 430/910; 430/916; 430/919
[58] Field of Search ....................... 204/159.18, 159.23; 430/281, 916, 919, 287, 288, 910

[56] References Cited

U.S. PATENT DOCUMENTS 3,549,367  12/1970  Chang et al. ..................... 430/281
3,558,309   1/1971  Laridon et al. ................ 204/159.23
3,682,642   8/1972  Laridon et al. ................ 204/159.23
3,847,610  11/1974  Laridon et al. ................ 204/159.24

Primary Examiner—Jack P. Brammer
Attorney, Agent, or Firm—A. W. Breiner

[57] ABSTRACT

A photosensitive material is described which comprises a base and a solid photosensitive layer comprising a photopolymerizable compound and a photopolymerization initiating mixture consisting of an oxime ester, a photopolymerization initiator and a p-dialkylaminobenzene of the formula

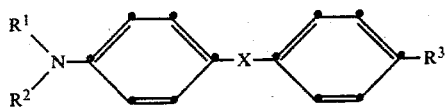

wherein $R^1$ and $R^2$ are lower alkyl, $R^3$ is hydrogen, alkyl, alkoxy or $N(R^1)(R^2)$ and X is —CO—, —CS—, $CH_2$, or —CH(OH)—. Synergistic photocuring sensitivity is obtained by said oxime ester in admixture with said p-dialkyl aminobenzene compound.

13 Claims, No Drawings

PHOTOPOLYMERIZABLE RECORDING MATERIALS

The present invention relates to improved photosensitive materials comprising a photopolymerisable layer.

Photopolymerisable compositions are known which comprise addition polymerisable ethylenically unsaturated compounds and an addition polymerization initiator called photoinitiator activatable by actinic radiation. A variety of applications have been described for these photopolymerisable compositions. The photopolymerisable compositions can be applied e.g. as photosensitive layer on surfaces of metal or of other materials. Upon exposure to actinic radiation through a suitable image pattern, the radiation induces polymerisation in the exposed areas of the photopolymerisable layer, whereby the exposed areas are rendered insoluble in the solvent or solvents used for applying the photopolymerisable layer. Thereafter the non-exposed areas are washed away with a solvent for the ethylenically unsaturated monomeric material. In this way can be formed planographic printing plates, matrices for printing matter, screens for silk-screen printing, and photo-resists for etching.

New photoinitiators are constantly being sought for to fulfil particular requirements such as stability or compatibility in a particular composition and/or to increase the speed of photopolymerisation. Particularly in the field of image recording e.g. in the graphic arts field it is highly desirable to dispose of recording materials that have a high photosensitivity and that are easily and rapidly processable e.g. by automatic wash-off processing by means of a solvent and preferably by means of a mere aqueous alkaline liquid.

It has been attempted to increase the photopolymerisation rate by the use of a combination of photoinitiators. From U.S. Pat. No. 3,549,367 of Catherine Teh-Lin Chang and Roxy Ni Fan, issued Dec. 22, 1970 it is known that the combined use of p-aminophenylketones e.g. Michler's ketone with lophinedimers in particular 2,4,5-triarylimidazolyldimers in the photopolymerisation of ethylenically unsaturated compounds, gives a synergistic response, the resultant performance being greater than a simple additive function.

According to GB-Pat. No. 1,486,911 filed Sept. 17, 1974 by SCM Corporation it has been found that ethylenically unsaturated binders filled with pigments can be much more easily UV-cured when including a synergistic sensitizer which is 2,2'-dithiobis(benzothiazole), or a halogen derivative of naphthalene in combination with an aromatic carbonyl photosensitizer and aromatic ketones or aldehyde photosensitizers which are different from the aromatic carbonyl photosensitizer. The aromatic carbonyl photosensitizers include aromatic amino photosensitizers e.g. Michler's ketone and the aromatic ketones and aldehydes include for example acetophenone, benzophenone, alkyl ethers of benzoin and likewise, 1,2-propanedione oxime and the esters and ethers thereof. Aromatic ketones containing an oxime ester group are described as photoinitiators e.g. in the U.S. Pat. No. 3,558,309 of Urbain Leopold Laridon and Gerard Albert Delzenne, issued Jan. 26, 1971.

However, Michler's ketone cannot be considered as a photoinitiator or sensitizer that will give under any circumstances with any other photoinitiator a synergistic photopolymerisation effect.

On the contrary, according to experimentation the p-aminophenylketones e.g. Michler's ketone have no influence on the photopolymerisation rate of photosensitive materials based on the use of photopolymerisable ethylenically unsaturated compounds and as initiator a compound containing at least one diacyldiazomethane group as described in U.S. Pat. No. 3,682,642 of Urbain Leopold Laridon, Gérard Albert Delzenne, Albert Lucien Poot and Hugo Karel Peeters, issued Aug. 8, 1972, or a compound containing at least one diazosulphone group as described in U.S. Pat. No. 3,847,610 of Urbain Leopold Laridon, Gérard Albert Delzeene and Hugo Karel Peeters, issued Nov. 12, 1974. Moreover, Michler's ketone acts as a photopolymerisation inhibitor on the photopolymerisation in bulk of a liquid photopolymerisable compound containing dispersed or dissolved therein an oxime ester, as well as on the photopolymerisation in aqueous or organic solution of an ethylenically unsaturated compound and the said oxime ester.

It was therefore surprising the find experimentally that when selecting for the photopolymerisation of a photopolymerisable compound in a solid layer, from the last mentioned synergistic combination of three sensitizers, the combination of Michler's ketone as aromatic carbonyl compound or an analogous compound within the scope of general formula (I) as defined hereinafter together with an oxime ester photopolymerisation initiator as aromatic ketone different from the aromatic carbonyl compound, the main sensitizer namely 2,2'-dithio-bis(benzothiazole) or halogenated derivated of naphthalene can be dispensed with, with maintenance of high sensitivity.

So in accordance with the present invention a photosensitive material is provided which comprises a base having thereon a solid photosensitive layer comprising a photopolymerisable ethylenically unsaturated organic compound or compounds and a photopolymerisation initiating mixture substantially consisting of a p-dialkylamino benzene corresponding to the general formula (I):

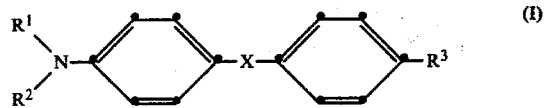

wherein:
X represents

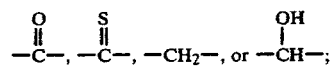

each of $R^1$ and $R^2$, the same or different, represents a lower ($C_1$-$C_5$) alkyl group, and
$R^3$ represents hydrogen, an alkyl group, an alkoxy group or a $N(R^1)(R^2)$ group wherein each of $R^1$ and $R^2$ has one of the above meanings, and
an "oxime ester photopolymerisation initiator" being a compound containing at least one oxime ester group of the following structure:

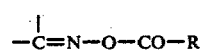

wherein R is an organic group.

Specific oxime esters which can be used as photopolymerisation initiator can be represented by the following general formulae (II) or (III):

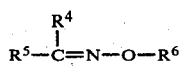

and

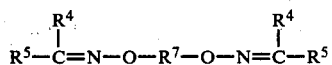

wherein:

$R^4$ represents an alkyl group comprising 1 or 2 carbon atoms, an aryl group, an alkaryl group, an aralkyl group, a hydroxy-substituted aralkyl group, or a substituted or unsubstituted acyl group, $R^5$ represents a hydrogen atom, an alkyl group comprising 1 or 2 carbon atoms, an aryl group, or a substituted or unsubstituted acyl group or wherein $R^4$ and $R^5$ together represent the necessary atoms to form with the adjacent carbon atom a cycloalkyl group, a phenanthrone group, or an indanone group, $R^6$ represents a substituted or unsubstituted acyl group, and $R^7$ represents a diacyl group.

Preferably at least one of $R^4$ and $R^5$ is an acyl group. The acyl groups for $R^4$, $R^5$ and $R^6$ are preferably acyl groups derived from aliphatic or aromatic carboxylic or sulphonic acids e.g. benzoyl, phenylsulphonyl, naphthoyl, 2-antraquinonyl-carbonyl, acetyl, propionyl, phenylacetyl, cinnamoyl, alkoxycarbonyl e.g. ethoxycarbonyl and N-substituted carbamoyl e.g. N-phenylcarbamoyl.

Particularly curing speed improving oxime ester photoinitiators are the following:

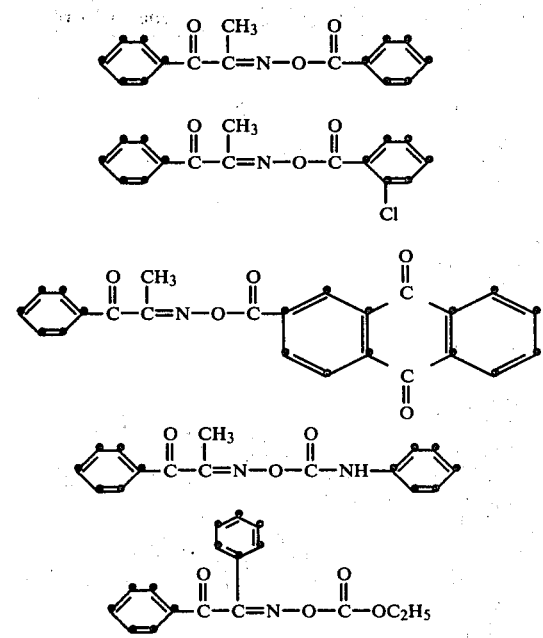

Highly synergistically operating dialkylamino benzenes corresponding to the above general formula (I) are:

4-dimethylamino benzophenone,
4,4'-bis(dimethylamino)-benzophenone (Michler's ketone),
4,4'-bis(dimethylamino)-benzhydrol,
4,4'-bis(dimethylamino)-diphenylmethane,
4,4'-bis(dimethylamino)-benzothiophenone.

For curing purposes the photosensitive layer may comprise one or more ethylenically unsaturated polymerisable compounds such as styrene, acrylamide, methacrylamide, methyl methacrylate, diethylaminoethyl methacrylate, and acrylonitrile. When two of these monomers are used in the same photopolymerisable layer, copolymers are formed during the photopolymerisation. It is further presumed that in the case where the photopolymerisable material is used together with a polymeric binding agent, graft copolymers are formed between the polymeric binder and the photopolymerised material.

The photopolymerisable composition may also comprise one or more unsaturated compounds having more than one carbon-to-carbon double bond, e.g. two terminal vinyl groups, or of a polymeric compound having ethylenic unsaturation. During polymerisation of these compositions usually cross-linking will occur by means of the plurally unsaturated compound. Examples of polymeric compounds containing ethylenically unsaturation are, e.g., allyl esters of polyacrylic acid, maleic esters of polyvinyl alcohol, polyhydrocarbons still containing carbon-to-carbon double bonds, unsaturated polyesters, cellulose acetomaleates, and allylcellulose.

The photosensitive layer of the present invention preferably comprises plurally unsaturated polymerisable compounds examples of which are:
divinylbenzene,
diglycol diacrylates,
N,N'-alkylene bis-acrylamides,
triethyleneglycol-diacrylate,
triethyleneglycol dimethacrylate,
pentaerythritol triacrylate,
pentaerythritol tetraacrylate,
trimethylolpropane trimethacrylate,
bisphenol A-diacrylate.

The ratio of oxime ester to dialkylamino benzene can vary between wide limits and the most suitable ratio can easily be determined by running a series of tests. Generally the ratio by weight is comprised between 1:1 and 10:1. The mixture of photopolymerisation initiators is generally used in an amount between 10 and 50% by weight with respect to the amount of photopolymerisable monomer(s).

A base or support may be coated with a solution of the ethylenically unsaturated organic compound in a solvent therefor, this solution containing in dissolved state or homogeneously dispersed therein a photopolymerisation initiating mixture substantially consisting of the oxime ester and of the dialkylamino benzene as defined hereinbefore, whereupon the solvent or solvent mixture is eliminated by known means such as evaporation, leaving a more or less thin coating of the ethylenically unsaturated organic compound on the base or support. The thickness of the dried photosensitive recording layer is preferably in the range of 0.5 to 5 μm. Thereafter the dried photopolymerisable coating can be exposed to actinic light rays.

The photosensitive composition or recording layer may be exposed to any source of radiation providing UV-radiation, more particularly radiation of wavelengths in the range of 250–400 nm, preferably in the wave-length region of 300–400 nm. Suitable light sources include carbon arcs, mercury vapour lamps, fluorescent lamps, argon glow lamps, photographic flood lamps and tungsten lamps. Moreover, ordinary daylight may also be used. Pulsed xenon lamps and tungsten lamps mainly emitting in the visible light range and to a minor amount in the ultraviolet region may likewise be used.

It is desirable that the photopolymerisable composition comprises a carrier or binding agent for the ethylenically unsaturated organic compound, and the photopolymerisation initiating mixture substantially consisting of the oxime ester and of the dialkylamino benzene. By the presence of this binding agent the properties of the light-sensitive layer are of course influenced. The choice of the binding agent is dependent on its solubility in solvents which can also be used as solvents for the ethylenically unsaturated compounds, for the oxime ester and the dialkylamino benzene.

Suitable binding agents are, e.g. polystyrene, polymethyl methacrylate, polyvinyl acetate, polyvinylbutyral, partially saponified cellulose acetate and other polymers that are soluble in solvents for the initiators and monomers. Water-soluble polymers can also be used such as gelatin, casein, starch, carboxymethylcellulose, and polyvinyl alcohol. The ratio of photopolymerisable monomer to binding agent obviously also influences the photopolymerisation. The larger this ratio the higher the photopolymerisation rate generally will be for one and the same ethylenically unsaturated organic compound.

In a preferred embodiment of the invention the photosensitive layer comprises as binding agent an alkali-soluble polymer. In that case the photosensitive recording layer, after exposure to light, may be developed in aqueous alkaline medium so that the use of expensive and sometimes inflammable organic solvents for washing away the unexposed areas of the photosensitive layer is avoided.

As alkali-soluble polymers can be used copolymers with units of unsaturated monocarboxylic acids, e.g. acrylic acid, methacrylic acid, and crotonic acid, unsaturated dicarboxylic acids e.g. maleic acid, fumaric acid, itaconic acid, and citraconic acid as well as half-esters and half-amides of these dicarboxylic acids. These unsaturated carboxylic acids are copolymerised with ethylenically unsaturated compounds, which are substantially insoluble in alkaline medium and which are present in the copolymer in such a proportion that the copolymer itself remains soluble in alkaline medium. Ethylenically unsaturated compounds that can be used for the copolymerisation are styrene and derivatives thereof, vinyl chloride, vinylidene chloride, vinyl esters such as vinyl acetate, acrylates, methacrylates, acrylonitrile, methacrylonitrile e.g. copoly(ethylene/maleic acid) and copoly (methyl methacrylate/methacrylic acid).

Especially suitable are the alkali-soluble copolymers of methyl methacrylate and methacrylic acid wherein the ratio by weight between the monomeric units varies between about 90:10 and about 75:25, more preferably between 85:15 and 80:20, and wherein the intrinsic viscosity of the copolymers measured in tetrahydrofuran at 20° C. is comprised between about 0.05 and about 0.20 dl/g, corresponding to molecular weights of about 7000 to 40,000.

These alkali-soluble copolymers of methylmethacrylate and methacrylic acid offer at the same time easy removability of the non-exposed portions and good mechanical strength i.e. resistance to abrasion of the exposed portions.

The photosensitive layer according to the present invention comprises according to the preferred embodiment a photopolymerisable ethylenically unsaturated (preferably plurally unsaturated) organic compound, examples of which have been given hereinbefore, the mixture of an oxime ester photopolymerisation initiator and of a p-dialkylamino benzene as defined hereinbefore, and an alkali-soluble copolymer of methylmethacrylate and methacrylic acid as defined hereinbefore. The layer preferably has a thickness comprised between 0.5 and 5 $\mu$m.

The proportions in the photosensitive layer of alkali-soluble polymer and of (preferably plurally) unsaturated polymerisable compound are generally such that an ultraviolet exposure of said layer of maximum 1 minute can effect at room temperature (20° C.) a decrease in solubility of the exposed parts such that these parts do not dissolve in an aqueous solution (20° C.) of 0.5 to 3% by weight of sodium hydroxide within 20 seconds. Weight ratios of alkali-soluble polymer to (preferably plurally) unsaturated polymerisable compound between 1:2 and 5:1 are preferred.

The amounts of oxime ester and of dialkylamino benzene added to the mixture of alkali-soluble polymer and of (preferably plurally) unsaturated compound may also vary between wide limits. Good results are obtained with 0.5–5% by weight of dialkylamino benzene and 2.5–10% by weight of oxime ester, preferably 1.5–2.5% by weight of dialkylamino benzene and 5–7.5% by weight of oxime ester, calculated on the added weight of alkali-soluble polymer and of (plurally) unsaturated compound.

The base of the photosensitive recording material of this invention may be coated with a photosensitive layer at one or both sides and may be made of any material as long as it does not deleteriously affect the photopolymerisation process. Typical flexible sheet materials are paper supports, e.g., coated at one or both sides with an alpha-olefin polymer, e.g. polyethylene. It is also possible to use cellulose nitrate film, cellulose acetate film, poly(vinyl acetal) film, polystyrene film, poly(ethylene terephthalate) film, polycarbonate film, poly-alpha-olefins such as polyethylene and polypropylene film, and related films such as a drafting film e.g. of the type described e.g. in the U.S. Pat. Nos. 3,115,420 of John M. Centa, Albert L. Van Stappen and Louis F. Vogt Jr., issued Dec. 24, 1963 and No. 3,627,563 of Raymond S. Reichards issued Dec. 14, 1971. The support is usually about 0.05 to 0.15 mm in thickness.

If the base is made of a transparent resin or glass, transparencies can be made starting from photosensitive layers containing dyes or pigments. These transparencies may be used for projection, e.g. with an overhead projector. If the support is an opaque paper, e.g. baryta coated paper, and the photosensitive layers contain dyes or pigments, opaque colour proofs can be made by washing-off. The support may be likewise a drafting film containing a pigment layer comprising so-called toothing agents to enable writing with pencil therein. If the support is made of metal a photoresist can be prepared with a photosensitive coating according to the present invention, which resist may be used as etch-resist.

Metal bases or bases coated with metals such as e.g. zinc, and especially aluminium, are excellently suited as base materials for a planographic printing plate. For the production of a planographic printing plate there may be likewise used plates of stone or glass and specially treated sheets of paper or polymeric film supports coated with a metallic layer that in its turn is coated with the photosensitive recording layer. For use in the production of intaglio or relief printing plates, metal base materials suited for etching are used, e.g. metal plates or drums of zinc, copper, steel or an etchable magnesium alloy. For use in the production of printed circuits the photosensitive composition is applied, e.g., to a supported copper layer, which can be easily etched.

In the production of miniaturized integrated electrical components the photosensitive composition serves to form a shielding pattern, e.g., on a semiconductor substrate or insulator wherein by techiques such as vapour deposition, oxidation, ion implantation, electrodeless deposition, ion-milling or etching, matter is added or removed to offer the desired electronic properties to the non-shielded material.

As is apparent from the above the photosensitive coating can be used in a large variety of applications.

Photosensitive materials according to the present invention are particularly suitable for the production of micro-images. For that purpose the photosensitive coatings are applied to a relatively thin highly opaque black or grey metal coating on a film support, the metal coating being etchable and thus serving as imaging layer. Suited metal coatings are tellurium and tellurium alloy coatings having a thickness preferably in the range of 50 nm to 500 nm and bismuth coatings having a thickness preferably in the range of 25 nm to 300 nm.

According to one embodiment in the composition of the metallic imaging layer tellurium alloys comprising at least 50 atomic percent of tellurium are used. Typical tellurium compositions, which are etchable with an aqueous hypochlorite solution are e.g. described in the published German patent application (DE-OS) No. 2,723,613 filed May 12, 1977 by Agfa-Gevaert A.G.

According to another and more preferred embodiment the imaging metal layer consists of bismuth. Bismuth possesses the advantage of directly adhering to organic resin supports such as a polyethylene terephthalate support when deposited thereon from bismuth vapour under reduced pressure conditions. Typical bismuth coatings have been described in DE-OS No. 2,723,613, already mentioned hereinbefore and in U.S. Pat. No. 4,138,262 of Harvey H. Wacks, Masatsugu Izu and Donald J. Sarrach, issued Feb. 6, 1979.

Vapour deposition techniques are sufficiently known to those skilled in the art e.g. of preparing photoconductive selenium coatings (see e.g. U.S. Pat. No. 3,874,917 of Charles Wood, John C. Schottmiller and Francis W. Ryan, issued Apr. 1, 1975 and U.S. Pat. No. 3,884,688 of John C. Schottmiller, Francis W. Ryan and Charles Wood, issued May 20, 1975).

Bismuth forms a black, non-light-reflecting coating showing no crazing and it provides a very high spectral density. Indeed, a bismuth layer already at a coating thickness of 80 nm shows a spectral density of about 3. A 100 nm bismuth layer has a spectral density of about 5.

A bismuth layer for a recording material according to the present invention is preferably applied to a polymeric film support, e.g. a sheet or belt. Preferably a polyethylene terephthalate support, e.g. of 0.07 to 0.1 mm thickness, is used.

The photosensitive materials according to the present invention are prepared by coating the ingredients forming the photosensitive layer to the selected substrate by a known coating technique, e.g. by spin-coating, whirl-coating, spraying, dip-coating, roller-coating, air-knife coating, doctor-blade coating, etc. The coating composition may comprise besides the ingredients referred to hereinbefore matting agents e.g. silica particles in association with urea-formaldehyd resin, polymethylmethacrylate particles, etc., antistatic agents, coating aids e.g. anionic, cationic and surface active agents, silicon oils, in particular polydimethylsiloxan, etc.

Before their application is the form of a coating these ingredients are dissolved preferably in a low-boiling solvent, e.g. acetone, that after the coating step is removed by evaporation.

The thickness of the dried photosensitive layer may be in the range of 0.5 to 20 $\mu$m but is preferably between 1 and 5 $\mu$m.

The present invention includes a recording method comprising the steps of information-wide exposing to actinic radiation a photosensitive material comprising a base coated with a photosensitive layer as referred to hereinbefore whereby in the exposed areas at least one ethylenically unsaturated compound(s) is or are polymerised (copolymerised) and removing the non-exposed or insufficiently exposed portions of the layer by washing with a solvent for the ethylenically unsaturated compound(s).

The present invention includes the use of the present recording material in a recording method for forming metal images. Said method includes the steps of:
(1) information-wise exposing to actinic radiation in particular UV-radiation a recording material comprising a transparent film support bearing an opaque metal coating and thereover an alkali-soluble photosensitive layer as hereinbefore defined,
(2) overall contacting the photosensitive layer with an aqueous alkaline liquid to remove selectively the non-exposed or insufficiently exposed portions of the photosensitive layer, and
(3) contacting the bared portions of the opaque metal layer with a liquid that is capable of chemically removing said portions without removing the exposed portions of the photosensitive layer.

The exposure may be an exposure through a contacting transparent master pattern or a projection exposure.

The concentration of alkaline substance, e.g. potassium hydroxide, used for developing the resist layer, i.e. for selectively removing the unexposed photosensitive layer portions, may vary widely. Thus, e.g., 0.4 to 7.5% by weight aqueous solutions of potassium hydroxide may be used.

Other alkaline substances which may be used for washing away the non-exposed portions of the photosensitive layer include 0.25 to 5% aqueous solutions of sodium hydroxide and 1 to 10% aqueous solutions of potassium carbonate.

For the chemical etching of a tellurium-containing layer preferably aqueous solutions of 0.5 to 30% of sodium hypochlorite are used.

For the etching of a bismuth layer preference is given to aqueous acidic iron (III) chloride solution. The concentration of iron (III) chloride is, e.g., in the range of 5 to 20% by weight. Said solution contains preferably from 0.25 to 1% weight of citric acid.

A likewise useful etching solution for the removal of bismuth is an aqueous solution containing 3 to 6% by weight of hydrogen peroxide and 5 to 10% by weight of sulphuric acid. Instead of hydrogen peroxide sodium perborate or urea peroxide, e.g. $NaBO_2.H_2O_2.3H_2O$ and $NH_2CONH_2.H_2O_2$ can be used.

The processing of the photo-exposed recording materials of the present invention is advantageously carried out in an automatic processing apparatus, in which the material is transported automatically through processing stations in which the removal of the still soluble portions of the photosensitive layer and the etching (if necessary) of the bared imaging layer portions take place in successive stations.

For example in a particularly suitable processing apparatus for use in the production of metal-images e.g. bismuth-images according to the present invention, a first station comprises a tray for holding an appropriate alkaline aqueous liquid, through which the exposed recording material is transported. After the alkaline development stage the surplus alkaline liquid absorbed in and adhering to the material is removed by passing the developed material through a second tray filled with plain water, whereupon the material is led through a third tray containing a suitable etch solution for the bared portions of the metallic imaging layer. Processing is completed by carrying the material through a fourth tray containing plain water for rinsing the material. Processing preferably proceeds at room temperature (about 18 to about 25° C.) but may proceed at higher temperatures. Care must be taken, however, not to damage the photosensitive layer.

The alkaline developing station and etching station can be arranged separately but preferably they are grouped in a compact unit, in which the recording material is carried automatically at a constant speed from the alkaline developing tray into the other trays.

The total processing for the formation of the metal images in said trays normally lasts but about 30 seconds at 20°-30° C. Taken with the high speed of the photosensitive layer requiring exposure times in the order of seconds, the present invention provides a rapid, highly reliable and convenient method for the formation of metal images.

A useful processing apparatus is, e.g., a common 4-tray processing station as used in the known four-bath silver halide stabilisation processing (see e.g. G.B. Pat. No. 1,243,180 filed Oct. 11, 1967 by Gevaert-Agfa N.V.) more particularly the RAPIDOPRINT unit DD 1437 (RAPIDOPRINT is a trade-mark of AGFA-GEVAERT N.V. Belgium).

The present invention makes it possible to produce metal images with very high contrast and excellent resolution at low cost. So, mass production of microform images is made possible in a simple manner at high speed and half-tone images with high screen dot quality can be produced in a simple inexpensive equipment at low unit cost.

The synthesis of the alkali-soluble polymeric binding agents is exemplified in the following preparations:

Preparation 1

The following solution was formed:

| | |
|---|---|
| methyl methacrylate | 40 g |
| methacrylic acid | 10 g |
| 4,4'-azo-bis-4-cyanovaleric acid | 1.5 g |
| methanol | 500 ml |

This solution was refluxed for 24 hours under a nitrogen atmosphere while continuously stirring. After cooling the solution was poured into water. The white, powdery precipitate was isolated and was dried under vacuun. Yield: 45 g of co(methyl methacrylate/methacrylic acid), having an intrinsic viscosity in tetrahydrofuran (20° C.) of 0.155 dl/g. The copolymer comprised 18.4% by weight of methacrylic acid units.

Preparation 2

A solution of 45 g of methyl methacrylate, 5 g of methacrylic acid and 1.5 g of 4,4'-azo-bis-4-cyanovaleric acid in 500 ml of methanol was refluxed for 24 hours while stirring under a nitrogen atmosphere. After cooling the solution was poured into water and the white, powdery precipitate was isolated and dried under vacuum. Yield: 44 g of co(methyl methacrylate/methacrylic acid) having an intrinsic viscosity (20° C.) in tetrahydrofuran of 0.124 dl/g and comprising about 10% by weight of methacrylic acid units.

Preparation 3

A solution of 800 g of methyl methacrylate, 200 g of methacrylic acid and 30 g of 4,4'-azo-bis-4-cyanovaleric acid in 10 l of acetone was refluxed for 24 hours while stirring under nitrogen atmosphere. After cooling a solution was obtained having a viscosity of 1.25 mPa.s at 20° C. and having a copolymer concentration of 8%. This solution can be used as such, without it being necessary to separate the copolymer. The separated copolymer had an intrinsic viscosity in tetrahydrofuran (20° C.) of 0.173 dl/g and comprised 18.3% by weight of methacrylic acid units.

The invention will be illustrated by some specific examples, which are essentially non-limiting for the invention. All percentages are by weight, unless otherwise indicated.

EXAMPLE 1

The following solution was made:

| | |
|---|---|
| copolymer solution of Preparation 3 | 100 ml |
| pentaerythritol triacrylate | 4 g |
| 2,6-di-t-butyl-p-cresol | 0.012 g |
| methanol | 40 ml |
| acetone | 66 ml |
| ethylene glycol monomethyl ether | 10 ml |

To 11 ml portions of the above solution were added quantities of photopolymerisation initiator as indicated in the following table. The different coating compositions formed were applied to a layer of bismuth of 150 nm having an optical density of more than 4. This layer had been vapour deposited under vacuum onto a polyethylene terephthalate film of 0.1 mm.

The different coating compositions were coated 50 μm thick on the bismuth layer so that, after drying for 15 minutes at 80° C. light-sensitive layers of 3 μm were formed.

The minimum time of exposure needed for reproduction was then determined. Exposure of the light-sensitive layers through an original line image occurred in a SPEKTRAPROOF apparatus of Siegfried Theimer GmbH with a doped 2000 W high pressure mercury vapour lamp. Processing occurred in a RAPIDOPRINT DD 1347 four bath unit in a total processing time of 30 seconds at 20°-30° C.

The composition of the four baths was as follows:

1. contained 1 l of a 0.5% sodium hydroxide solution. The non-exposed portions of the light-sensitive layer were dissolved away,
2. contained 1 l of water for rinsing,
3. contained a solution of 90 g of $NaBO_2.H_2O_2.3H_2O$ in 1 l of 2.5 N sulfuric acid. The bared portions of the bismuth layer were eliminated;
4. contained 1 l of water for rinsing.

In the first bath a 10% aqueous solution of potassium carbonate could be used as an alternative.

Contrasting black-and-white images were obtained. The exposure times are summarized in the following table 1.

TABLE 1

| photopolymerisation initiator | quantity | minimum exposure time needed |
|---|---|---|
| Michler's ketone | 0.06 g | 20 s |
| Oxime ester of formula 1 above | 0.06 g | 20 s |
| Oxime ester of formula 2 above | 0.06 g | 25 s |
| Oxime ester of formula 3 above | 0.06 g | 30 s |
| Michler's ketone + oxime ester 1 | 0.015 g 0.045 g | 4 s |
| Michler's ketone + oxime ester 2 | 0.015 g 0.045 g | 7 s |
| Michler's ketone + oxime ester 3 | 0.015 g 0.045 g | 15 s | it appears from the above that when adding Michler's ketone to an oxime ester in the absence of any other photoinitiator a synergistic effect on the photopolymerisation and insolubilisation was obtained. The exposure time of 20 to 30 seconds needed was reduced to 4 seconds in the most favourable combination.

EXAMPLE 2

The photosensitive coating composition was composed as follows:

| copolymer of preparation 1 | 3.6 g |
|---|---|
| pentaerythritol triacrylate | 1.8 g |
| Michler's ketone | 0.14 g |
| oxime ester of formula 1 | 0.40 g |
| 2,6-di-t-butyl-p-cresol | 0.0054 g |
| methanol | 20 ml |
| methyl ethyl ketone | 75 ml |
| ethylene glycol mono methyl ether | 5 ml |

This coating composition was applied 50 μm thick to a bismuth layer as described in example 1 so that after drying for 15 minutes at 80° C. a photosensitive layer of 3 μm was formed.

This layer was exposed for 5 seconds in the SPEKTRAPROOF apparatus through a negative original and developed as explained in example 1. A positive image was obtained.

After having been stored for 72 hours at 57° C. and a relative humidity of 34% the photosensitive recording material retained its original ability of being processed and had the same sensitivity.

EXAMPLE 3

To 10 ml of the coating composition of example 2, 5 ml of acetone were added. A layer was applied on a bismuth layer as described in Example 1 in such a way that after drying at 80° C. for 15 minutes it was 2 μm thick. The photosensitive coating was exposed for 3 seconds as described in Example 1. The exposed material was processed as in Example 1 with the difference that the first developing bath contained 1 l of 0.25% aqueous sodium hydroxide solution.

A positive image was formed.

EXAMPLE 4

The coating composition for the photosensitive layer was composed as follows:

| copolymer of Preparation 1 | 1.5 g |
|---|---|
| pentaerythritol triacrylate | 0.5 g |
| Michler's ketone | 0.05 g |
| oxime-ester of formula 1 | 0.15 g |
| 2,6-di-t-butyl-p-cresol | 0.002 g |
| methanol | 10 ml |
| methyl ethyl ketone | 25 ml |
| ethylene glycol monomethyl ether | 1.6 ml |

The composition was applied on a bismuth layer as described in Example 1 to form a photosensitive layer of 3 μm when dry. The layer was exposed for 5 seconds as described in Example 1. The exposed material was processed as in Example 1, with the difference that the first tray contained 1 l of 1.5% aqueous sodium hydroxide solution.

A positive image was obtained.

EXAMPLE 5

The coating composition for the photosensitive layer was composed as follows:

| copolymer of preparation 2 | 3 g |
|---|---|
| pentaerythritol triacrylate | 3 g |
| 2,6-di-t-butyl-p-cresol | 0.006 g |
| Michler's ketone | 0.15 g |
| oxime ester of formula 1 | 0.45 g |
| methanol | 30 ml |
| methyl ethyl ketone | 75 ml |
| ethylene glycol monomethyl ether | 5 ml |

The composition was applied on a bismuth layer as described in Example 1 to form a photosensitive layer of 3 μm when dry. The photosensitive layer was exposed for 2 seconds through a negative in the SPEKTRAPROOF apparatus described above. After dipping for 20 seconds in a 2% aqueous sodium hydroxide solution and rinsing with water, the material was conducted through the third and fourth bath of the DD 1437 apparatus of Example 1, wherein the bared bismuth parts were dissolved away, thereby forming a positive image of the original.

EXAMPLE 6

The following coating composition was formed:

| copolymer of Preparation 1 | 2 g |
|---|---|
| copolymer of Preparation 2 | 2 g |
| pentaerythritol triacrylate | 2 g |
| 2,6-di-t-butyl-p-cresol | 0.006 g |
| Michler's ketone | 0.15 g |
| oxime ester of formula 1 | 0.45 g |
| methanol | 30 ml |
| methyl ethyl ketone | 75 ml |
| ethylene glycol monomethyl ether | 5 ml |

Upon formation of a 3 μm thick dry layer on the bismuth layer, exposure for 2 seconds through a negative as in Example 1, and processing as in Example 1, the first bath of the processing apparatus being formed by 1 l of 1.5% aqueous sodium hydroxide solution, a positive image was formed.

EXAMPLE 7

The exposed film of Example 6 was only conducted through the first and second bath of the DD 1437 apparatus, used in example 6, so that only the non-exposed parts of the photosensitive layer had been washed away.

The processed film was rubbed in with a 2% aqueous phosphoric acid solution, whereby the bared bismuth parts were made hydrophilic. The film could now be used as a printing plate in offset-printing, the hardened parts of the resist taking up ink. 5000 prints could be made easily.

EXAMPLE 8

The coating composition described in Example 6 was applied on an aluminium plate to form thereon after drying a 3 μm thick layer. This layer was exposed for 2 seconds through a negative as described in Example 1 and processed in the first and second bath of the DD 1437 apparatus as used in Example 7. Only the non-exposed parts of the photosensitive layer were washed away. Just as in Example 7 the processed aluminium plate was then rubbed with a 2% aqueous phosphoric acid solution so that the bared aluminium parts were made hydrophilic. The plate could now be used as a printing plate in offset-printing.

EXAMPLES 9 to 16

The coating composition for the photosensitive layer was composed as follows:

| | |
|---|---|
| alkali-soluble copolymer | see table |
| plurally unsaturated monomer | see table |
| Michler's ketone | 0.075 g |
| oxime ester of formula 1 | 0.225 g |
| 2,6-di-t-butyl-p-cresol | 0.003 g |
| methanol | 10 ml |
| methyl ethyl ketone | 40 ml |
| ethylene glycol monomethyl ether | 5 ml |

The coating compositions were coated on the bismuth layer applied to a polyethylene terephthalate film as described in Example 1, so that after drying at 80° C. for 15 minutes a photosensitive layer of 3 μm thick was formed.

The photographic recording material was exposed through a negative in the SPEKTRAPROOF apparatus described above and processed in the DD 1437 apparatus of Example 1.

In Examples 9, 10 and 11 the first developing bath contained a 1% aqueous sodium hydroxide solution. In Examples 11, 12, 13 and 15 a 0.5% solution was used and in Example 14 a 2% solution was used. The other baths were composed as described in Example 1.

The alkali-soluble copolymer, the plurally unsaturated monomer in the different examples and the minimum time of exposure needed to form a good positive image are given in the following table 2.

TABLE 2

| Example | Alkali-soluble copolymer | Amount | Plurally unsaturated monomer | Amount | Minimum exposure needed |
|---|---|---|---|---|---|
| 9 | copolymer of preparation 1 | 2 g | triethylene glycol diacrylate | 1 g | 10 s |
| 10 | id. | 2.25 g | id. | 0.75 g | 10 s |
| 11 | id. | 2 g | triethylene glycol dimethacrylate | 1 g | 15 s |
| 12 | id. | 2.25 g | id. | 0.75 g | 10 s |
| 13 | id. | 2 g | trimethylolpropane trimethacrylate | 1 g | 3 s |
| 14 | id. | 2.25 g | id. | 0.75 g | 5 s |
| 15 | id. | 2 g | pentaerythritol tetraacrylate | 1 g | 4 s |
| 16 | id. | 2.25 g | id. | 0.75 g | 4 s |

EXAMPLE 17 to 19

Copolymers of methyl methacrylate and methacrylic acid (84:16% by weight) but having different molecular weights were tested as follows:

| | |
|---|---|
| coating compositions were formed containing: | |
| binding copolymer | 2 g |
| pentaerythritol triacrylate | 1 g |
| Michler's ketone | 0.075 g |
| oxime ester of formula 1 | 0.225 g |
| 2,6-di-t-butyl-p-cresol | 0.003 g |
| aceton | 70 ml |
| ethylene glycol monomethyl ether | 12 ml |

In Example 17 the copolymer used had an intrinsic viscosity in tetrahydrofuran (at 20° C.) of 0.165 dl/g. In Example 18, the intrinsic viscosity was 0.23 dl/g (at 20° C.) and in Example 19 it was 0.40 dl/g (at 20° C.).

The coating compositions were applied on a polyethylene terephthalate film that had been previously provided with a bismuth layer as described in Example 1. Coating was such that after drying a photosensitive layer of 2 μm resulted.

The three different recording materials were exposed for 5 seconds in a SPEKTRAPROOF apparatus as described above, exposure occurring through a stepwedge with a 0.15 constant. For processing a DD 1437 apparatus was used the first bath containing a 0.5% sodium hydroxide solution, the other baths being composed as indicated in Example 1.

The sensitivity of the recording materials is indicated in the following table 3.

TABLE 3

| Example | Intrinsic viscosity dl/g | Number of steps reproduced |
|---|---|---|
| 17 | 0.165 | 5 |
| 18 | 0.23 | 7 |
| 19 | 0.40 | 8 |

It could be concluded from the above table 3 that the sensitivity of the recording material increased with increasing intrinsic viscosity, thus with increasing molecular weight of the alkali-soluble binding copolymer. However, in Examples 18 and 19 the exposed parts were not completely dissolved away, although they became permeable for the etching liquid. The reason therefore was that in these Examples 18 and 19 the molecular weight of the copolymer was already too high, so that it became impossible to dissolve away the non-exposed parts in the 7 seconds allowed for developing in the apparatus.

As indicated in the description the intrinsic viscosity of the copolymer is preferably comprised between 0.05 and 0.20 dl/g.

EXAMPLE 20

The following solution was prepared:

| | |
|---|---|
| 10% aqueous solution of co(methyl methacrylate-methacrylic acid) (82.5:17.5% by weight) having an intrinsic viscosity of 0.19 dl/g | 20 ml |
| 10% solution in acetone of pentaerythritol triacrylate | 10 ml |
| 0.1% solution in acetone of 2,6-di-t-butyl cresol | 3 ml |
| 1% solution in acetone of oxime ester of formula 1 | 15 ml |
| acetone | 45 ml |
| ethylene glycol monomethyl ether | 15 ml |

5 mg of a dialkylamino benzene as indicated in the following table were added to 11 ml amounts of the above solution and the solutions formed were coated on a bismuth layer which had been vapour deposited on a polyethylene terephthalate film. Coating was such that after drying for 15 minutes at 80° C. a photosensitive layer of about 1.5 μm was obtained.

The different photosensitive layers were exposed for 20 seconds in a SPEKTRAPROOF apparatus as described above using an iron(III) chloride doped high pressure mercury vapour lamp of 2000 Watt. Exposure occurred through a step-wedge with a 0.15 constant.

A DD 1437 apparatus was used for processing, the first bath of which contained 1 liter of a 1% sodium hydroxide solution. The three other baths were composed as in Example 1.

In the following table 4 the number of reproduced steps are given. It is to be noted that in test No. 1 the photosensitive layer contained only as initiator the oxime ester of formula 1, and no dialkylamino benzene was added. In tests Nos. 2 to 4, dialkylamino benzenes were added that do not correspond to the formula given above.

TABLE 4

| Test no. | Dialkylamino benzene | Number of steps reproduced |
|---|---|---|
| 1 | none | 1 |
| 2 | CH₃–N(CH₃)–C₆H₄–CHO | 1 |
| 3 | C₂H₅–N(C₂H₅)–C₆H₄–CHO | 1 |
| 4 | CH₃–N(CH₃)–C₆H₄–C(O)–CH₃ | 1 |
| 5 | CH₃–N(CH₃)–C₆H₄–C(O)–C₆H₄–N(CH₃)CH₃ | 10 |
| 6 | CH₃–N(CH₃)–C₆H₄–C(O)–C₆H₄–N(CH₃)CH₃ | 12 |
| 7 | CH₃–N(CH₃)–C₆H₄–CH(OH)–C₆H₄–N(CH₃)CH₃ | 10 |
| 8 | CH₃–N(CH₃)–C₆H₄–CH₂–C₆H₄–N(CH₃)CH₃ | 4 |
| 9 | CH₃–N(CH₃)–C₆H₄–C(S)–C₆H₄–N(CH₃)CH₃ | 7 |

It could be concluded that the addition of a dialkylamino benzene that does not correspond to the formula of the dialkylamino benzenes given above, had no influence at all on the photopolymerization. The number of steps reproduced was the same in tests 2 to 4 as in test no. 1, wherein the dialkylamino benzene was absent.

On the contrary dialkylamino benzenes which correspond to the given formula, had a synergistic effect on the photopolymerisation, as showed by the number of reproduced steps indicated for tests 5 to 9 in the table 4. The best results, namely 12 steps were found in test no. 6 when using Michler's ketone as dialkylamino benzene.

When replacing the ketoxime ester of formula 1 by that of formula (4) and using as dialkylamino benzene Michler's ketone the number of reproduced steps is 10.

EXAMPLE 21

The following solution (I) was prepared by mixing:

| | |
|---|---|
| 10% solution in acetone of co(methyl methacrylate-methacrylic acid) (83.6:16.4 by weigtht) having an intrinsic viscosity of 0.15 dl/g measured in tetrahydrofuran at 20° C. | 30 ml |
| 10% solution in acetone of pentaerythritol triacrylate | 15 ml |
| 0.1% solution in acetone of silicone oil | 5 ml |
| 0.1% dispersion in methanol of colloidal silica as matting agent | 10 ml |
| acetone | 40 ml |
| ethylene glycol monomethylether | 20 ml |

As indicated in the following table 5, said solution (I) containing about 4% of solids was coated in admixture with the indicated photoinitiating mixture onto a bismuth layer of optical density 4.5 which had been vapour deposited on a polyethylene terephthalate film. Coating was effected in such a way that after drying for 15 min at 80° C. a photosensitive layer of 2 μm was obtained.

The exposure and processing of the obtained samples proceeded as described in Example 1 with the difference, however, that in the first bath a 1.5% aqueous sodium hydroxide solution was used. In said Table 5 also the number of reproduced steps is given.

TABLE 5

| Ingredients | \multicolumn{14}{c}{Number of samples} | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Solution (I) | 12ml | 12ml | 12ml | 12ml | 12ml | 12ml | 12ml | 12ml | 12ml | 12ml | 12ml | 12ml | 12ml | 12ml |
| Michler's ketone | 7mg | 7mg | 7mg | 7mg | 7mg | 7mg | 7mg | 7mg | 7mg | 7mg | — | — | 7mg | 7mg |
| Oxime ester (1) | 25mg | 25mg | 25mg | — | — | — | — | — | — | — | — | — | — | — |
| Benzophenone | — | — | — | 25mg | 25mg | 25mg | — | — | — | — | — | — | — | — |
| Isopropyl ether of benzoin | — | — | — | — | — | — | 25mg | 25mg | 25mg | — | — | — | — | — |
| 2,2'-dithiobis-(benzothiazole) | — | 7mg | — | — | 7mg | — | — | 7mg | — | — | 7mg | — | 7mg | — |
| 1-(chloromethyl)-naphthalene | — | — | 7mg | — | — | 7mg | — | — | 7mg | — | — | 7mg | — | 7mg |
| number of reproduced steps | 11 | 11 | 11 | 4 | 4 | 3 | 3 | 2 | 3 | 2 | 0 | 0 | 3 | 3 |

We claim:

1. A photosensitive element which comprises a base having thereon a solid photosensitive layer wherein said layer comprises as essential materials at least one polymerisable ethylenically unsaturated organic compound and a photopolymerisation initiating mixture consisting essentially of an oxime ester photopolymerisation initiator and a p-dialkylamino benzene corresponding to the general formula (I):

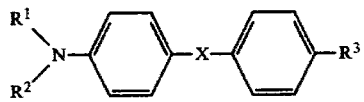

wherein:
X represents

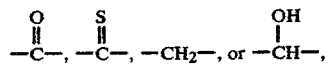

each of $R^1$ and $R^2$, the same or different, represents a lower alkyl group, and
$R^3$ represents a hydrogen atom, an alkyl group, an alkoxy group or a $N(R^1)$ $(R^2)$ group wherein each of $R^1$ and $R^2$ has the above meaning, and wherein the oxime ester and the dialkylaminobenzene are present in a ratio by weight of from about 1:1 and 10:1 and the said mixture with respect to the polymerisable ethylenically unsaturated compound is present at from about 10 and 50% by weight.

2. A photosensitive material according to claim 1, wherein the dialkylamino benzene is Michler's ketone.

3. A photosensitive material according to claim 1, wherein the oxime ester photopolymerisation initiator corresponds to one of the general formulae (II) or (III):

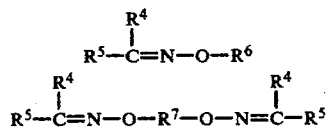

wherein:
$R^4$ represents an alkyl group of 1 or 2 carbon atoms, an aryl group, an alkaryl group, an aralkyl group, a hydroxy-substituted aralkyl group, or an acyl group, $R^5$ represents a hydrogen atom, an alkyl group of 1 or 2 carbon atoms, an aryl group or an acyl group, or wherein
$R^4$ and $R^5$ together represent the atoms necessary to form with the adjacent carbon atom a cycloalkyl group, a phenanthrone group, or an indanone group,
$R^6$ represents an acyl group, and
$R^7$ represents a diacyl group.

4. A photosensitive material according to claim 3, wherein at least one of $R^4$ and $R^5$ is an acyl group.

5. A photosensitive material according to claim 1, wherein the polymerisable ethylenically unsaturated organic compound is a plurally unsaturated polymerisable compound.

6. A photosensitive material according to claim 5, wherein the plurally unsaturated polymerisable compound is pentaerythritol triacrylate.

7. A photosensitive material according to claim 1, wherein the photosensitive layer also comprises a polymeric binding agent.

8. A photosensitive material according to claim 7, wherein the polymeric binding agent is an alkali-soluble polymer.

9. A photosensitive material according to claim 8, wherein the alkali-soluble polymer is a copoly(methyl methacrylate-methacrylic acid) wherein the ratio by weight between the methyl methacrylate and the methacrylic acid units varies between about 90:10 and about 75:25 and said copolymer has an intrinsic viscosity measured in tetrahydrofuran at 20° C. comprised between about 0.05 and about 0.20 dl/g.

10. A photosensitive material according to claim 8, wherein in the photosensitive layer the ratio by weight between the alkali-soluble binding agent and the ethylenically unsaturated polymerisable compound is comprised between 1:2 and 5:1.

11. A photosensitive material according to claim 8, wherein in the photosensitive layer the oxime ester compound is present in an amount of 5–7.5% by weight, and the dialkylamino benzene is present in an amount of 1.5–2.5% by weight, based on the joint weight of unsaturated polymerisable compound and of alkali-soluble binding agent.

12. A photosensitive material according to claim 1, wherein the base comprises a highly opaque metal coating on a film support.

13. A photosensitive material according to claim 12, wherein the base is composed of a polyethylene terephthalate film support provided with a bismuth coating.

* * * * *